US012203807B2

(12) United States Patent
Nishino

(10) Patent No.: US 12,203,807 B2
(45) Date of Patent: Jan. 21, 2025

(54) LIGHT RECEIVING ELEMENT AND RANGING SYSTEM

(71) Applicant: SONY SEMICONDUCTOR SOLUTIONS CORPORATION, Kanagawa (JP)

(72) Inventor: Tatsuki Nishino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 997 days.

(21) Appl. No.: 17/250,689

(22) PCT Filed: Aug. 16, 2019

(86) PCT No.: PCT/JP2019/032124
§ 371 (c)(1),
(2) Date: Feb. 19, 2021

(87) PCT Pub. No.: WO2020/045124
PCT Pub. Date: Mar. 5, 2020

(65) Prior Publication Data
US 2021/0325244 A1    Oct. 21, 2021

(30) Foreign Application Priority Data

Aug. 31, 2018    (JP) ................. 2018-163585

(51) Int. Cl.
*G01J 1/44*    (2006.01)
*G01S 7/486*    (2020.01)
(Continued)

(52) U.S. Cl.
CPC ............... *G01J 1/44* (2013.01); *G01S 7/486* (2013.01); *G01S 17/931* (2020.01); *H01L 31/107* (2013.01); *G01S 17/89* (2013.01)

(58) Field of Classification Search
CPC ........... G01S 7/4863; G01J 2001/4466; H01L 31/107
See application file for complete search history.

(56) References Cited

U.S. PATENT DOCUMENTS 10,542,246 B2 *   1/2020  Kovacovsky ........ H04N 13/218
2007/0194213 A1   8/2007  Augusto

FOREIGN PATENT DOCUMENTS

JP    2008-508701 A    3/2008
JP    2010-193437 A    9/2010
(Continued)

OTHER PUBLICATIONS

International Search Report and Written Opinion of PCT Application No. PCT/JP2019/032124, issued on Oct. 21, 2019, 07 pages of ISRWO.

*Primary Examiner* — Yuqing Xiao
*Assistant Examiner* — Clara G Chilton
(74) *Attorney, Agent, or Firm* — CHIP LAW GROUP

(57) ABSTRACT

There is provided a light receiving element and a ranging system which achieve reduction in the number of signal lines which output detection signals. The light receiving element includes a pixel array in which a plurality of pixels is arranged in a matrix, and a pixel driving unit configured to control respective pixels of the pixel array to be active pixels or non-active pixels, in which the pixel driving unit controls the pixels to be the active pixels in units of spot including N×M pixels (N>0, M>0, where N and M do not become 1 at a same time), and one signal line which outputs a detection signal is disposed at the pixel array for a plurality of spot constituent pixels of a same type within one unit where the one unit includes L×L pixels (L>1).

6 Claims, 15 Drawing Sheets

(51) Int. Cl.
*G01S 17/931* (2020.01)
*H01L 31/107* (2006.01)
*G01S 17/89* (2020.01)

(56) References Cited

FOREIGN PATENT DOCUMENTS

| | | |
|---|---|---|
| JP | 2015-78953 A | 4/2015 |
| JP | 2016-176750 A | 10/2016 |

* cited by examiner

LIGHT RECEIVING ELEMENT AND RANGING SYSTEM

CROSS REFERENCE TO RELATED APPLICATIONS

This application is a U.S. National Phase of International Patent Application No. PCT/JP2019/032124 filed on Aug. 16, 2019, which claims priority benefit of Japanese Patent Application No. JP 2018-163585 filed in the Japan Patent Office on Aug. 31, 2018. Each of the above-referenced applications is hereby incorporated herein by reference in its entirety.

TECHNICAL FIELD

The present technology relates to a light receiving element and a ranging system, and more particularly, to a light receiving element and a ranging system which achieve reduction in the number of signal lines which output detection signals.

BACKGROUND ART

In recent years, a range image sensor which measures a range using a time-of-flight (ToF) method has attracted attention. In the range image sensor, for example, a pixel array in which pixels using single photon avalanche diodes (SPADs) are arranged in a matrix is used. In the SPAD, avalanche amplification occurs if one photon enters a high-field PN junction region in a state where a voltage higher than a breakdown voltage is applied. A range can be measured with high accuracy by detecting a timing at which a current instantaneously flows upon occurrence of the avalanche amplification.

The range image sensor in which pixels using SPADs are arranged in a matrix is driven so that part of pixels are set as active pixels which detect photons, and the remaining pixels are set as non-active pixels which do not detect photons. For example, in a pixel array at a light detecting unit disclosed in Patent Document 1, pixels arranged in two dimensions are selected as active pixels in units of column.

CITATION LIST

Patent Document

Patent Document 1: Japanese Patent Application Laid-Open No. 2015-78953

SUMMARY OF THE INVENTION

Problems to be Solved by the Invention

Signal lines which output detection signals can be made common in units of row in a case where a range image sensor is driven so that pixels are selected as active pixels in units of column. However, in this case, a plurality of pixels in the same row cannot be set as active pixels at the same time. Providing individual signal lines for each pixel makes the number of wirings extremely large, which leads to a concern that crosstalk, delay, or the like, of detection signals may occur.

The present technology has been made in view of such circumstances and is directed to achieving reduction in the number of signal lines which output detection signals.

Solutions to Problems

A light receiving element according to the first aspect of the present technology includes a pixel array in which a plurality of pixels including SPADs in units of pixel is arranged in a matrix, and a pixel driving unit configured to control respective pixels of the pixel array to be active pixels or non-active pixels, in which the pixel driving unit controls the pixels to be the active pixels in units of spot including N×M pixels (N>0, M>0, where N and M do not become 1 at a same time), and one signal line which outputs a detection signal is disposed at the pixel array for a plurality of spot constituent pixels of a same type within one unit where the one unit includes L×L pixels (L>1).

A ranging system according to the second aspect of the present technology includes an illumination apparatus configured to radiate irradiation light, and a light receiving element configured to receive reflected light of the irradiation light, in which the light receiving element includes a pixel array in which a plurality of pixels including SPADs in units of pixel is arranged in a matrix, and a pixel driving unit configured to control respective pixels of the pixel array to be active pixels or non-active pixels, in which the pixel driving unit controls the pixels to be the active pixels in units of spot including N×M pixels (N>0, M>0, where N and M do not become 1 at a same time), and one signal line which outputs a detection signal is disposed at the pixel array for a plurality of spot constituent pixels of a same type within one unit where the one unit includes L×L pixels (L>1).

In the first and the second aspects of the present technology, respective pixels of a pixel array in which a plurality of pixels including SPADs in units of pixel is arranged in a matrix are controlled to be active pixels or non-active pixels, the pixels are controlled to be the active pixels in units of spot including N×M pixels (N>0, M>0, where N and M do not become 1 at a same time), and one signal line which outputs a detection signal is disposed at the pixel array for a plurality of spot constituent pixels of a same type within one unit where the one unit includes L×L pixels (L>1).

The light receiving element and the ranging system may be independent apparatuses or may be modules to be incorporated into other apparatuses.

MODE FOR CARRYING OUT THE INVENTION

Embodiments for implementing the present technology (hereinafter, referred to as embodiments) will be described below. Note that description will be provided in the following order.

1. Configuration example of ranging system
2. Configuration example of light receiving element
3. First pixel circuit configuration example
4. Setting example of active pixels and non-active pixels
5. First wiring example of detection signal lines
6. Second wiring example of detection signal lines
7. Second pixel circuit configuration example
8. Use example of ranging system
9. Application example to mobile object <1. Configuration Example of Ranging System>

Figure 1:
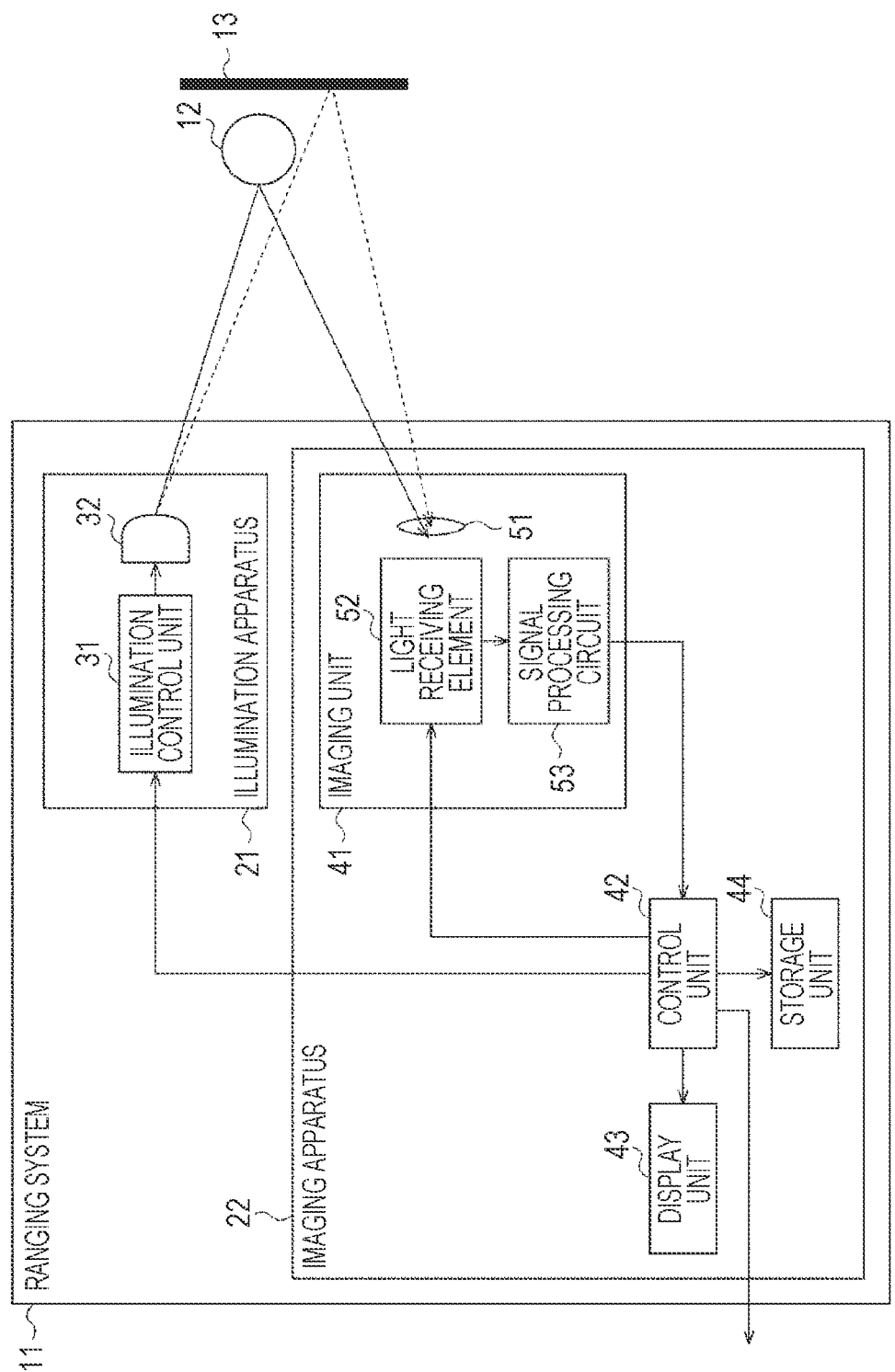
FIG. 1 is a block diagram illustrating a configuration example of an embodiment of a ranging system to which the present technology is applied.

FIG. 1 is a block diagram illustrating a configuration example of an embodiment of a ranging system to which the present technology is applied.

A ranging system 11 is, for example, a system which captures a range image using a ToF method. Here, the range image is an image which is obtained by detecting a range in a depth direction from the ranging system 11 to a subject for each pixel and which includes range pixel signals based on the detected ranges.

The ranging system 11 includes an illumination apparatus 21 and an imaging apparatus 22.

The illumination apparatus 21 includes an illumination control unit 31 and a light source 32.

The illumination control unit 31 controls a light irradiation pattern by the light source 32 under control by a control unit 42 of the imaging apparatus 22. Specifically, the illumination control unit 31 controls the light irradiation pattern by the light source 32 in accordance with an irradiation code included in an irradiation signal supplied from the control unit 42. For example, the irradiation code is a binary code of 1 (high) and 0 (low), and the illumination control unit 31 turns on the light source 32 when a value of the irradiation code is 1 and turns off the light source 32 when the value of the irradiation code is 0.

The light source 32 emits light of a predetermined wavelength range under control by the illumination control unit 31. The light source 32 includes, for example, an infrared laser diode. Note that a type of the light source 32 and a wavelength range of irradiation light can be arbitrarily set in accordance with uses, and the like, of the ranging system 11.

The imaging apparatus 22 is an apparatus which receives reflected light which is light (irradiation light) radiated from the illumination apparatus 21 and reflected on a subject 12, a subject 13, and the like. The imaging apparatus 22 includes an imaging unit 41, the control unit 42, a display unit 43 and a storage unit 44.

The imaging unit 41 includes a lens 51, a light receiving element 52 and a signal processing circuit 53.

The lens 51 forms an image of incident light on a light receiving surface of the light receiving element 52. Note that the lens 51 has an arbitrary configuration, and, for example, the lens 51 may include a plurality of lenses.

The light receiving element 52 includes, for example, a sensor in which single photon avalanche diodes (SPADs) are used in respective pixels. The light receiving element 52 receives reflected light from the subject 12, the subject 13, and the like, under control by the control unit 42 and supplies a pixel signal obtained as a result to the signal processing circuit 53. This pixel signal represents a digital count value obtained by counting a time from when the illumination apparatus 21 radiates irradiation light until when the light receiving element 52 receives the light. A light emission timing signal indicating a timing for the light source 32 to emit light is also supplied from the control unit 42 to the light receiving element 52.

The signal processing circuit 53 performs processing on the pixel signal supplied from the light receiving element 52 under control by the control unit 42. For example, the signal processing circuit 53 detects a range to the subject for each pixel on the basis of the pixel signal supplied from the light receiving element 52 and generates a range image indicating the range to the subject for each pixel. Specifically, the signal processing circuit 53 acquires a time (count value) from when the light source 32 emits light until when each pixel of the light receiving element 52 receives light, for each pixel a plurality of times (for example, several thousands to several tens of thousands of times). The signal processing circuit 53 creates a histogram corresponding to the acquired time. The signal processing circuit 53 then determines a time it takes light radiated from the light source 32 to return after being reflected on the subject 12 or the subject 13 by detecting a peak of the histogram. The signal processing circuit 53 further performs computation of obtaining a range to an object on the basis of the determined time and speed of light. The signal processing circuit 53 supplies the generated range image to the control unit 42.

The control unit 42 includes, for example, a control circuit such as a field programmable gate array (FPGA) and a digital signal processor (DSP), a processor, and the like. The control unit 42 controls the illumination control unit 31 and the light receiving element 52. Specifically, the control unit 42 supplies an irradiation signal to the illumination control unit 31 and supplies a light emission timing signal to the light receiving element 52. The light source 32 emits irradiation light in accordance with the irradiation signal. The light emission timing signal may be the irradiation signal supplied to the illumination control unit 31. Further, the control unit 42 supplies the range image acquired from the imaging unit 41 to the display unit 43 and causes the range image to be displayed at the display unit 43. Still further, the control unit 42 causes the range image acquired from the imaging unit 41 to be stored in the storage unit 44. Further, the control unit 42 outputs the range image acquired from the imaging unit 41 to outside.

The display unit 43 includes, for example, a panel display apparatus such as a liquid crystal display apparatus and an organic electro luminescence (EL) display apparatus.

The storage unit 44 can include an arbitrary storage apparatus, storage medium, or the like, and stores the range image, and the like.

<2. Configuration Example of Light Receiving Element>

Figure 2:
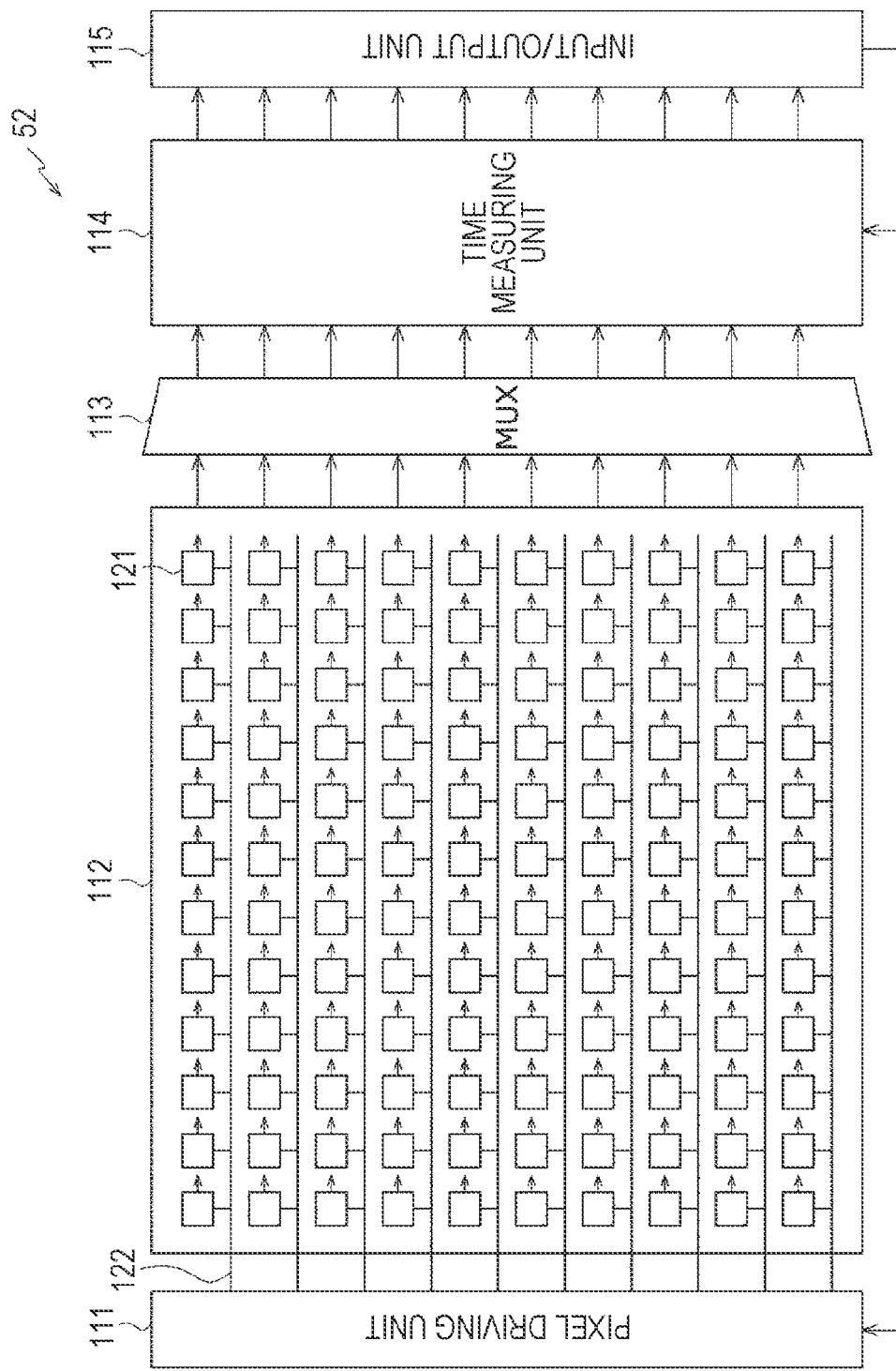
FIG. 2 is a block diagram illustrating a configuration example of a light receiving element in FIG. 1.

FIG. 2 is a block diagram illustrating a configuration example of the light receiving element 52.

The light receiving element 52 includes a pixel driving unit 111, a pixel array 112, a multiplexer (MUX) 113, a time measuring unit 114 and an input/output unit 115.

The pixel array 112 has a configuration in which pixels 121 which detect incidence of photons and output detection signals indicating detection results as pixel signals are arranged in two dimensions in a matrix in a row direction and in a column direction. Here, the row direction refers to an arrangement direction of the pixels 121 in a row of pixels, that is, a horizontal direction, and the column direction refers to an arrangement direction of the pixels 121 in a column of pixels, that is, a vertical direction. While FIG. 2 illustrates the pixel array 112 having a configuration of pixel arrangement of 10 rows and 12 columns due to space limitation, the number of rows and the number of columns of the pixel array 112 are not limited to these, and the pixel array 112 may have any number of rows and columns.

Pixel drive lines 122 are wired for each row of pixels along a horizontal direction on matrix pixel arrangement of the pixel array 112. The pixel drive line 122 transmits a drive signal for driving the pixel 121. The pixel driving unit 111 drives each pixel 121 by supplying a predetermined drive signal to each pixel 121 via the pixel drive line 122. Specifically, the pixel driving unit 111 performs control to set part of the pixels 121 among a plurality of pixels 121 arranged in two dimensions in a matrix as active pixels and set the remaining pixels 121 as non-active pixels at a predetermined timing in accordance with a light emission timing signal supplied from outside via the input/output unit 115. The active pixels are pixels which detect incidence of photons, and the non-active pixels are pixels which do not detect incidence of photons. A detailed configuration of the pixel 121 will be described later.

Note that while FIG. 2 illustrates the pixel drive line 122 as one wiring, the pixel drive line 122 may include a plurality of wirings. One end of the pixel drive line 122 is connected to an output end corresponding to each row of pixels of the pixel driving unit 111.

The MUX 113 selects output from the active pixel in accordance with switching between the active pixel and the non-active pixel within the pixel array 112. The MUX 113 then outputs a pixel signal input from the selected active pixel to the time measuring unit 114.

The time measuring unit 114 generates a count value corresponding to a time from when the light source 32 emits light until when the active pixel receives light on the basis of the pixel signal of the active pixel supplied from the MUX 113 and the light emission timing signal indicating the light emission timing of the light source 32. The light emission timing signal is supplied from outside (the control unit 42 of the imaging apparatus 22) via the input/output unit 115.

The input/output unit 115 outputs the count value of the active pixel supplied from the time measuring unit 114 to outside (the signal processing circuit 53) as the pixel signal. Further, the input/output unit 115 supplies the light emission timing signal supplied from the control unit 42 to the pixel driving unit 111 and the time measuring unit 114.

<3. First Pixel Circuit Configuration Example>

Figure 3:
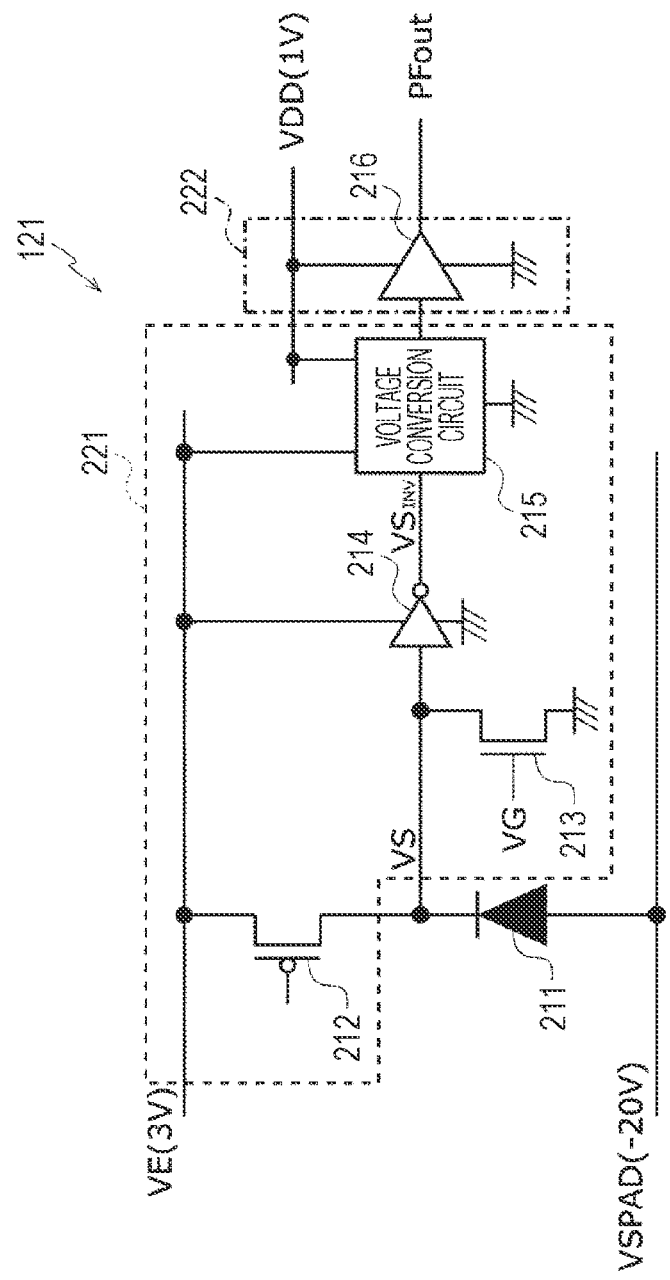
FIG. 3 is a view illustrating a configuration example of a first pixel circuit.

FIG. 3 illustrates a configuration example of a first pixel circuit of the pixel 121 arranged in the pixel array 112.

The pixel 121 illustrated in FIG. 3 includes an SPAD 211, a transistor 212, a transistor 213, an inverter 214, a voltage conversion circuit 215, and an output buffer 216. The transistor 212 includes a P-type MOS transistor, and the transistor 213 includes an N-type MOS transistor.

A cathode of the SPAD 211 is connected to a drain of the transistor 212 and is connected to an input terminal of the inverter 214 and a drain of the transistor 213. An anode of the SPAD 211 is connected to a power supply VSPAD.

The SPAD 211 is a photodiode (single photon avalanche photodiode) which avalanche amplifies a generated electron upon incidence of incident light to output a signal of a cathode voltage VS. The power supply VSPAD to be supplied to the anode of the SPAD 211 is, for example, set at a negative bias (negative potential) of −20 V.

The transistor 212 which is a constant current source which operates in a saturation region, performs passive quench by functioning as a quenching resistor. A source of the transistor 212 is connected to a power supply voltage VE, and a drain is connected to the cathode of the SPAD 211, the input terminal of the inverter 214, and the drain of the transistor 213. This allows the power supply voltage VE to be also supplied to the cathode of the SPAD 211. A pull-up resistor can be also used in place of the transistor 212 connected to the SPAD 211 in series.

A voltage (hereinafter referred to as an excess bias) higher than a breakdown voltage VBD of the SPAD 211 is applied to the SPAD 211 to detect light (photon) with sufficient efficiency. For example, assuming that the breakdown voltage VBD of the SPAD 211 is 20 V, and a voltage higher than the breakdown voltage VBD by 3 V is applied, the power supply voltage VE to be supplied to the source of the transistor 212 is set at 3 V.

A drain of the transistor 213 is connected to the cathode of the SPAD 211, the input terminal of the inverter 214 and the drain of the transistor 212, and a source of the transistor 213 is connected to ground (GND). A gating control signal VG is supplied to a gate of the transistor 213 from the pixel driving unit 111.

In a case where the pixel 121 is set as an active pixel, a Lo (Low) gating control signal VG is supplied to the gate of the transistor 213 from the pixel driving unit 111. Meanwhile, in a case where the pixel 121 is set as a non-active pixel, a Hi (High) gating control signal VG is supplied to the gate of the transistor 213 from the pixel driving unit 111.

The inverter 214 outputs a Hi signal $VS_{INV}$ when the cathode voltage VS as an input signal is Lo, and outputs a Lo signal $VS_{INV}$ when the cathode voltage VS is Hi. Hereinafter, the signal $VS_{INV}$ to be output by the inverter 214 will be also referred to as an inversion signal $VS_{INV}$.

The voltage conversion circuit 215 converts the inversion signal $VS_{INV}$ input from the inverter 214 into a low-voltage signal $VS_{LOW}$ and outputs the low-voltage signal $VS_{LOW}$ to the output buffer 216. The inversion signal $VS_{INV}$ becomes a signal having a voltage amplitude from 0 V to 3 V, and the voltage conversion circuit 215 converts this signal $VS_{INV}$ having a voltage amplitude from 0 V to 3 V into a signal $VS_{LOW}$ having a voltage amplitude from 0 V to 1 V. The output buffer 216 is an output unit which outputs the signal $VS_{LOW}$ input from the voltage conversion circuit 215 as a detection signal PFout indicating incidence of a photon on the SPAD 211.

In FIG. 3, the transistor 212, the transistor 213, the inverter 214 and the voltage conversion circuit 215 included in a dashed region 221 are elements (group) which operate at a power supply voltage VE which is a first power supply voltage. Meanwhile, the output buffer 216 included in a dashed-dotted region 222 is an element (group) which operates at a power supply voltage VDD which is a second power supply voltage lower than the first power supply voltage. The power supply voltage VDD is, for example, set at 1 V.

Operation in a case where the pixel 121 is set as the active pixel will be described next with reference to FIG. 4. FIG.

4 is a graph indicating change of the cathode voltage VS of the SPAD 211 in accordance with incidence of a photon and the detection signal PFout.

First, in a case where the pixel 121 is an active pixel, the transistor 213 is switched off by the Lo gating control signal VG.

Figure 4:
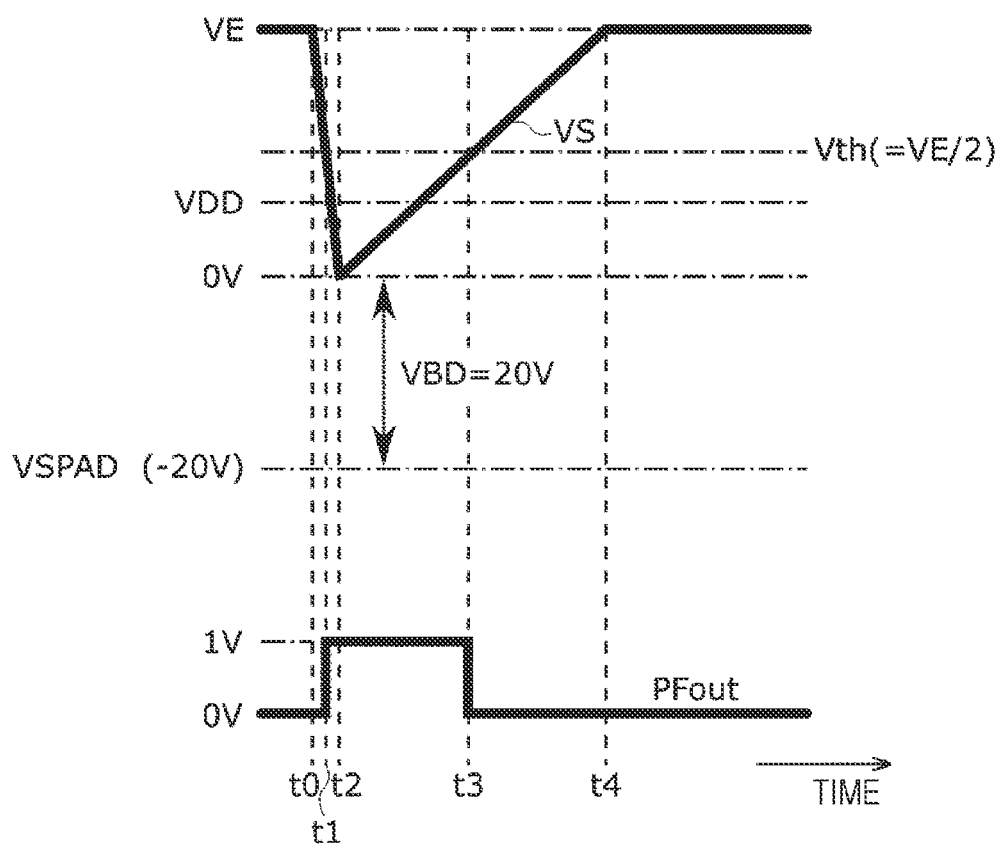
FIG. 4 is a view for explaining operation of a pixel in FIG. 3.

At time before time t0 in FIG. 4, the power supply voltage VE (for example, 3 V) is supplied to the cathode of the SPAD 211, and the power supply VSPAD (for example, −20 V) is supplied to the anode, and a reverse voltage higher than the breakdown voltage VBD (=20 V) is thereby applied to the SPAD 211, so that the SPAD 211 is put into a Geiger mode. In this state, the cathode voltage VS of the SPAD 211 is the same as the power supply voltage VE.

If a photon is incident on the SPAD 211 which is put into the Geiger mode, avalanche multiplication occurs, and a current flows to the SPAD 211.

If avalanche multiplication occurs at time t0, and a current flows to the SPAD 211, at and after time t0, a current also flows to the transistor 212 by a current flowing to the SPAD 211, thereby voltage drop occurs by a resistance component of the transistor 212.

If the cathode voltage VS of the SPAD 211 becomes lower than 0 V at time t2, avalanche amplification stops because the voltage is lower than the breakdown voltage VBD. Here, operation of stopping avalanche amplification as a result of voltage drop being occurred by a current generated by the avalanche amplification flowing to the transistor 212, and the cathode voltage VS becoming lower than the breakdown voltage VBD in association with occurrence of the voltage drop, is quench operation.

If the avalanche amplification stops, a current flowing through the resistor of the transistor 212 gradually decreases, the cathode voltage VS returns to the original power supply voltage VE again at time t4, and the pixel is put into a state where the pixel can detect a next new photon (recharge operation).

The inverter 214 outputs a Lo inversion signal $VS_{INV}$ when the cathode voltage VS which is an input voltage is equal to or higher than a predetermined threshold voltage Vth (=VE/2) and outputs a Hi inversion signal $VS_{INV}$ when the cathode voltage VS is lower than the predetermined threshold voltage Vth. The output buffer 216 also outputs a Lo detection signal PFout when the cathode voltage VS is equal to or higher than the predetermined threshold voltage Vth (=VE/2) and outputs a Hi detection signal PFout when the cathode voltage VS is lower than the predetermined threshold voltage Vth. In the example in FIG. 4, the output buffer 216 outputs the Hi detection signal PFout during a period from time t1 to time t3.

Note that in a case where the pixel 121 is set as a non-active pixel, a Hi gating control signal VG is supplied to the gate of the transistor 213 from the pixel driving unit 111 to switch on the transistor 213. This makes the cathode voltage VS of the SPAD 211 0 V (GND), and makes a voltage between the anode and the cathode of the SPAD 211 equal to or lower than the breakdown voltage VBD, so that the SPAD 211 does not react even if a photon is incident on the SPAD 211.

<4. Setting Example of Active Pixels and Non-Active Pixels>

A setting example of active pixels and non-active pixels will be described next.

The pixel driving unit 111 determines a predetermined number of spots SP determined in advance within the pixel array 112 assuming a plurality of adjacent pixels 121 as one spot (cluster) SP and sets active pixels. In the present embodiment, the pixel driving unit 111, for example, sets four pixels of 2×2 as one spot SP and sets 9 spots SP within the pixel array 112.

Figure 5:
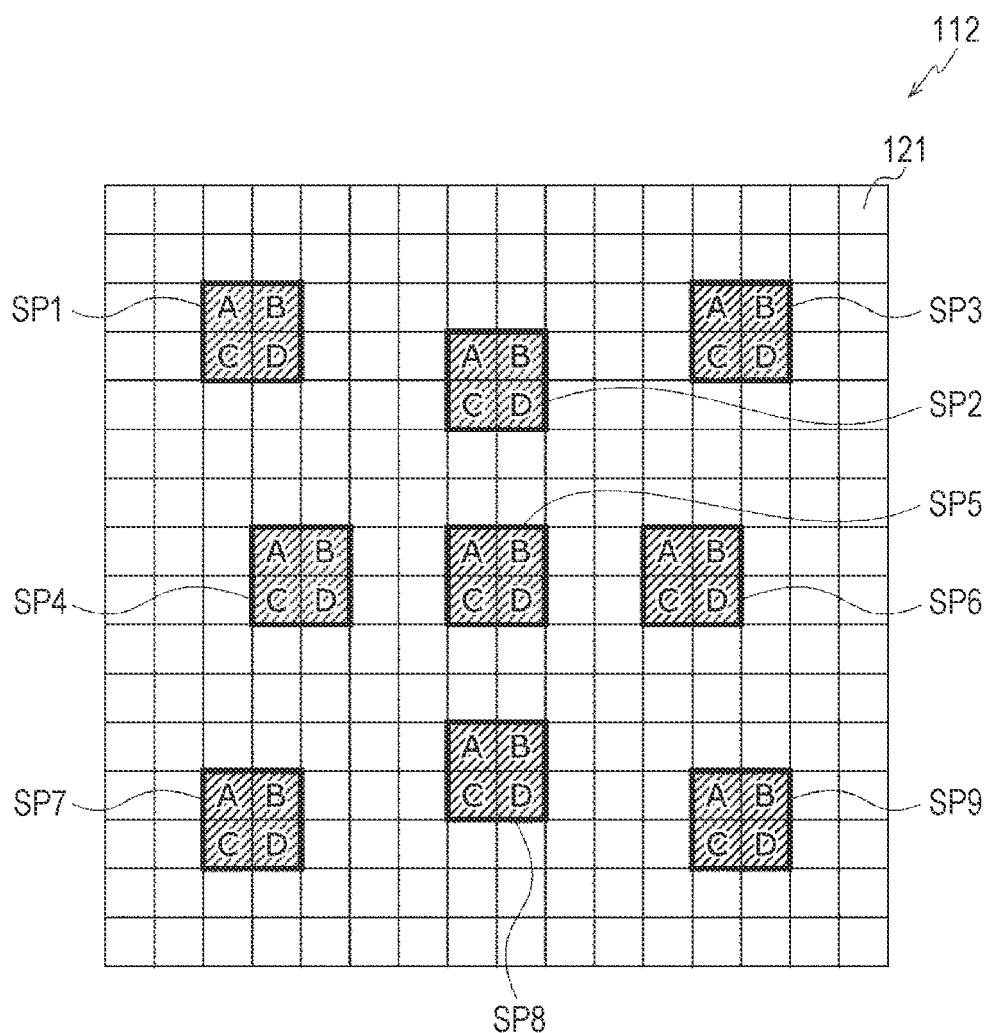
FIG. 5 is a view illustrating a setting example of active pixels and non-active pixels.

The pixel array 112 in FIG. 5 includes 256 pixels 121 of 16 rows and 16 columns. Among 256 pixels 121, hatched pixels 121 represent active pixels, and the pixels 121 which are not hatched represent non-active pixels.

The pixel driving unit 111, for example, sets predetermined spots SP1 to SP9 within the pixel array 112 as active pixels assuming four pixels of 2×2 as one spot SP. Note that hereinafter, respective pixels of 2×2 constituting one spot SP will be also referred to as SP constituent pixels. Further, in a case where respective SP constituent pixels which constitute one spot SP are distinguished, as illustrated in FIG. 5, the respective SP constituent pixels will be referred to as an SP constituent pixel A, an SP constituent pixel B, an SP constituent pixel C and an SP constituent pixel D in accordance with positions of the SP constituent pixels within the spot SP.

Note that while an example will be described in the present embodiment where one spot SP includes four pixels of 2×2, and the number of spots SP is nine, a configuration of pixels which constitute the spot SP is not limited to four pixels of 2×2. Further, the number of spots SP to be set for the pixel array 112 is not limited to nine. For example, the spot SP may be set as two pixels of 2×1, nine pixels of 3×3, or the like, and the number of spots SP to be set for the pixel array 112 may be set as four, six, or the like.

The pixel driving unit 111 further keeps resolution of an area of ranging as the imaging apparatus 22 at equal to or higher than a predetermined value by moving the position of each spot SP set as illustrated in FIG. 5 for each period.

By setting only part of pixels within the pixel array 112 as active pixels in this manner, it is possible to prevent a power supply from fluctuating as a result of an instantaneous operating current becoming too large and prevent the power supply fluctuation from affecting range accuracy. Additionally, spots are set as a target which is irradiated with laser light, and thus, by limiting the active pixels to part of spots SP in accordance with laser irradiation, it is possible to reduce power consumption.

<5. First Wiring Example of Detection Signal Lines>

Wiring layout of signal lines which transmit the detection signal PFout output by each pixel 121 of the pixel array 112 as a pixel signal will be described.

Figure 6:
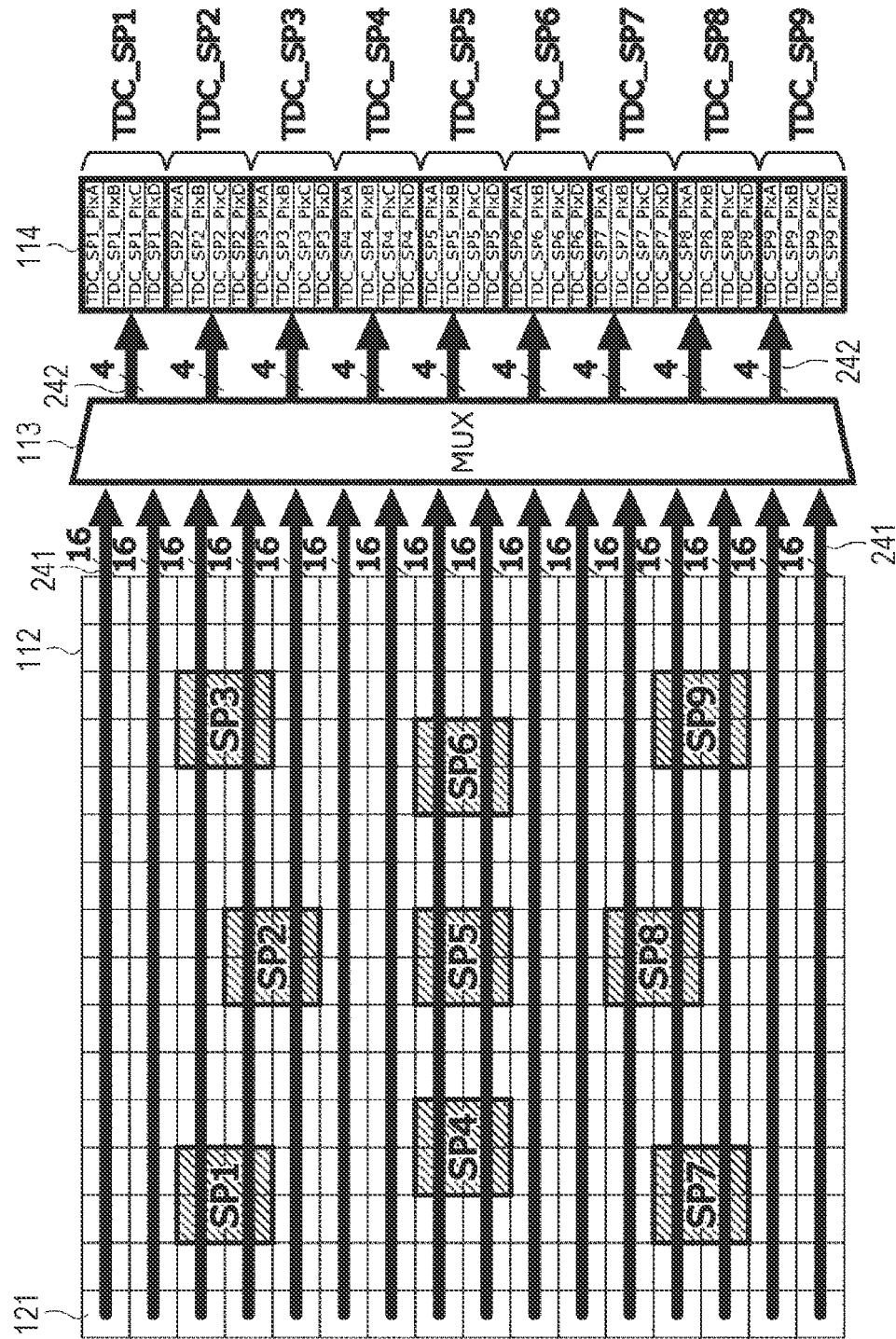
FIG. 6 is a view illustrating a first wiring example of signal lines.

FIG. 6 is a view illustrating a first wiring example of the signal lines which transmit the detection signal PFout.

The first wiring example is an arrangement example of the signal lines in a case where the signal lines which transmit the detection signal PFout are individually provided for each pixel.

In a case where the signal lines are individually provided for each pixel, 256 signal lines 241 which are 16 signal lines in each row are required for the whole pixel array 112 because the pixel array 112 includes 256 pixels 121 of 16 rows and 16 columns. FIG. 6 illustrates 16 signal lines 241 arranged in one row with one signal line due to space limitation.

The MUX 113 selects signal lines 241 of pixels 121 set as the active pixels among 256 pixels 121 and acquires the detection signals PFout from the active pixels. The number of the active pixels is 36 of 4 pixels (the number of pixels in one spot SP)×9 (the number of spots SP), and thus, the number of signal lines 242 to be output to the time measuring unit 114 from the MUX 113 becomes 36. FIG. 6 illustrates four signal lines 242 with one signal line due to space limitation.

The time measuring unit 114 includes time to digital converter (TDC) circuits corresponding to the detection signals PFout output from 36 active pixels. Specifically, the time measuring unit 114 includes TDC circuits (TDC_SP1_PixA to TDC_SP1_PixD) of SP constituent pixels A to D of a spot SP1, TDC circuits (TDC_SP2_PixA to TDC_SP2_PixD) of SP constituent pixels A to D of a spot SP2, TDC circuits (TDC_SP3_PixA to TDC_SP3_PixD) of SP constituent pixels A to D of a spot SP3, ..., TDC circuits (TDC_SP9_PixA to TDC_SP9_PixD) of SP constituent pixels A to D of a spot SP9. Each TDC circuit generates a count value corresponding to a time from when the light source 32 emits light until when the active pixel receives the light from the detection signal PFout of the active pixel and the light emission timing signal which are input.

As described above, by individually providing the signal lines 241 for each pixel, it is possible to deal with arbitrary nine spots SP1 to SP9 set within the pixel array 112. However, it is not realistic to individually provide the signal lines 241 for each pixel because the number of wirings becomes extremely large. Further, there is a concern that crosstalk between pixels and skew, signal delay, and the like, of the detection signals PFout may occur if the signal lines 241 are dense.

<6. Second Wiring Example of Detection Signal Lines>

To address this concern, a second wiring example for reducing signal lines which transmit the detection signals PFout will be described.

In the second wiring example, a plurality of adjacent pixels within the pixel array 112 is set as one unit U.

Figure 7:
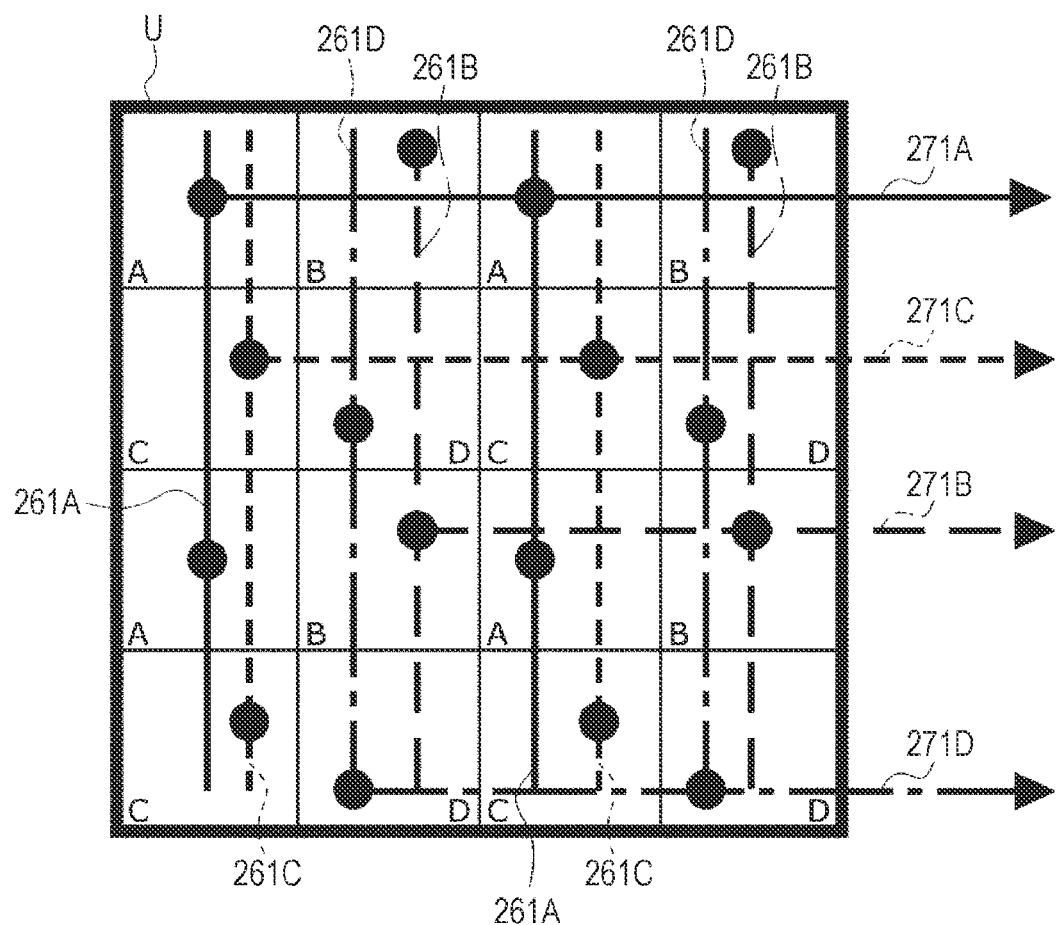
FIG. 7 is a view illustrating one unit.

FIG. 7 is a view illustrating one unit U in a case where 16 pixels of 4×4 are set as one unit U.

In a case where one unit U includes 16 pixels of 4×4, one unit U includes four spots SP each including 4 pixels of 2×2, and thus, one unit U includes four sets of SP constituent pixels A to D.

Output terminals of four SP constituent pixels A included in one unit U are connected using vertical wirings 261A, and a signal line 271A which transmits detection signals PFout of four SP constituent pixels A included in one unit U is disposed in a row of pixels of predetermined SP constituent pixels A within the unit U.

Output terminals of four SP constituent pixels B included in one unit U are connected using vertical wirings 261B, and a signal line 271B which transmits detection signals PFout of four SP constituent pixels B included in one unit U is disposed in a row of pixels of predetermined SP constituent pixels B within the unit U.

Output terminals of four SP constituent pixels C included in one unit U are connected using vertical wirings 261C, and a signal line 271C which transmits detection signals PFout of four SP constituent pixels C included in one unit U is disposed in a row of pixels of predetermined SP constituent pixels C within the unit U.

Output terminals of four SP constituent pixels D included in one unit U are connected using vertical wirings 261D, and a signal line 271D which transmits detection signals PFout of four SP constituent pixels D included in one unit U is disposed in a row of pixels of predetermined SP constituent pixels D within the unit U.

Further, signal lines 271A to 271D included in one unit U are disposed in rows of pixels which are different from each other.

By putting output of the SP constituent pixels of the same type within one unit U together with one signal line 271 using the vertical wirings 261 in this manner, it is possible to achieve connection to the MUX 113 with one signal line 271 for each row of pixels in one unit U. The number of signal lines 271 per one unit U becomes four.

Figure 8:
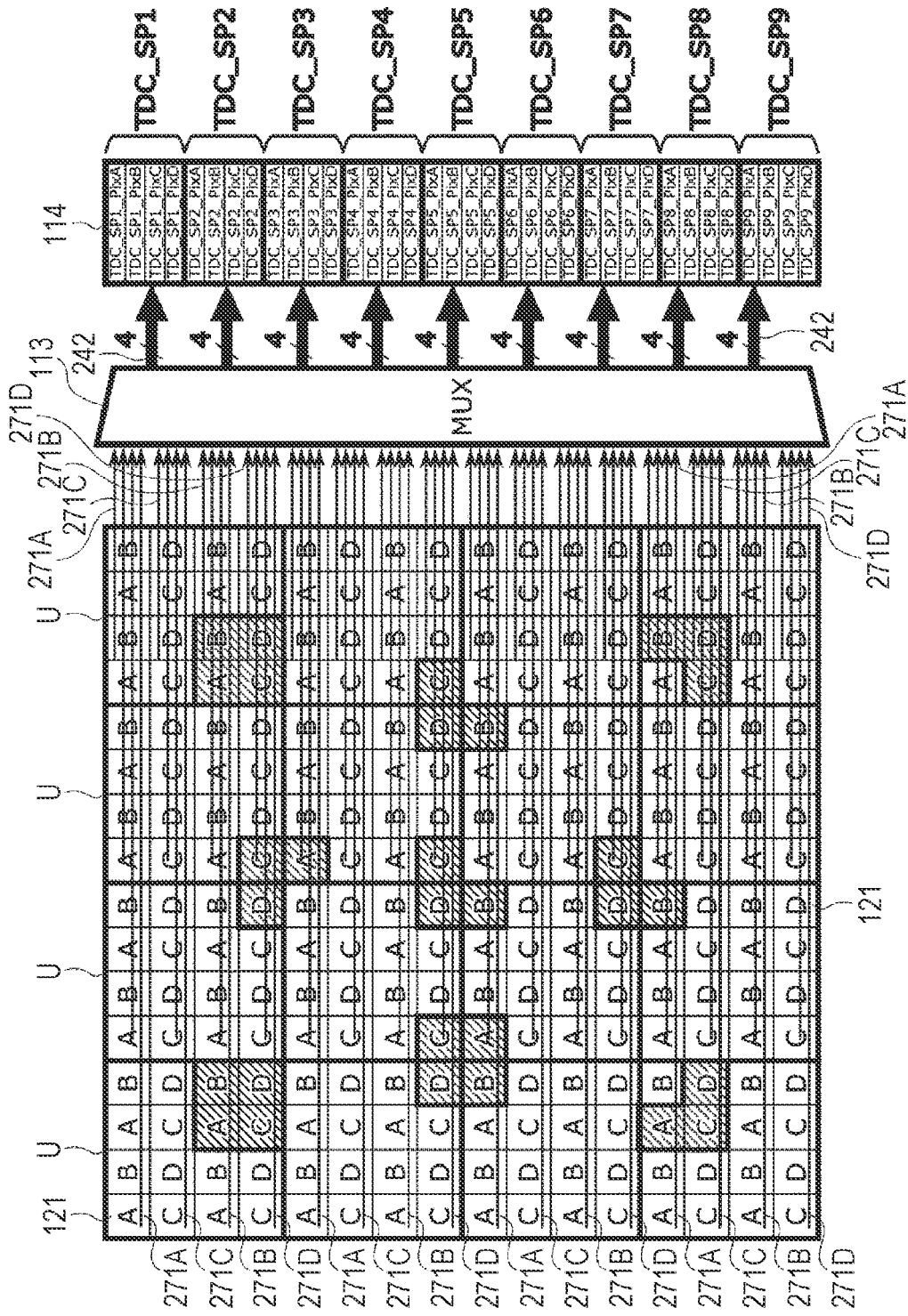
FIG. 8 is a view illustrating a second wiring example of signal lines.

FIG. 8 illustrates a wiring example of the signal lines 271 in a case where the signal lines 271 are put together for each of the SP constituent pixels A to D within the unit U as illustrated in FIG. 7.

FIG. 8 is a second wiring example in which signal lines which transmit the detection signals PFout are reduced.

In a case where the signal lines 271 are put together for each of the SP constituent pixels A to D within the unit U as illustrated in FIG. 7, the number of the signal lines 271 to the MUX 113 becomes 64 in the whole of the pixel array 112 as illustrated in FIG. 8. It is therefore possible to substantially reduce the number of the signal lines 271 to the MUX 113 according to the second wiring example compared to the first wiring example illustrated in FIG. 6. This can improve crosstalk and skew of the detection signal PFout at each pixel 121, signal delay, and the like.

In the second wiring example, a plurality of SP constituent pixels of the same type (one of the SP constituent pixels A to D) within the unit U utilizes one common signal line 271, and thus cannot be set as active pixels at the same time.

The pixel driving unit 111 therefore sets a plurality of spots SP for the pixel array 112 in accordance with the following spacing rule. In a case where one unit U includes 16 pixels of 4×4, the pixel driving unit 111 determines an adjacent spot SP so that the same type of the respective SP constituent pixels (SP constituent pixels A to D) of the spot SP comes fourth or any later in other adjacent spots SP both in a horizontal direction and in a vertical direction. In other words, the pixel driving unit 111 determines each spot SP so that a predetermined SP constituent pixel (for example, the SP constituent pixel A) in a first spot SP within the pixel array 112 is separate from the same type of the SP constituent pixel (for example, the SP constituent pixel A) of a second spot SP adjacent to the first spot SP by three or more pixels.

Setting of the spots SP in accordance with the spacing rule will be described with reference to FIG. 9.

For example, an SP constituent pixel D of the spot SP1 is separate from the same type of the SP constituent pixel D of the spot SP2 which is adjacent to the spot SP1 in a horizontal direction by three pixels. In other words, the SP constituent pixel D of the spot SP2 is the fourth pixel in a horizontal direction from the same type of the SP constituent pixel D of the adjacent spot SP1.

Further, the SP constituent pixel D of the spot SP1 is separate from the same type of the SP constituent pixel D of the spot SP4 which is adjacent to the spot SP1 in a vertical direction by three pixels. In other words, the SP constituent pixel D of the spot SP4 is the fourth pixel in a vertical direction from the same type of the SP constituent pixel D of the adjacent spot SP1.

For example, an SP constituent pixel B of the spot SP5 is separate from the same type of the SP constituent pixel B of the spot SP6 which is adjacent to the spot SP5 in a horizontal direction by three pixels. In other words, the SP constituent pixel B of the spot SP6 is the fourth pixel in a horizontal direction from the same type of the SP constituent pixel B of the adjacent spot SP5.

Further, the SP constituent pixel B of the spot SP5 is separate from the same type of the SP constituent pixel B of the spot SP8 which is adjacent to the spot SP5 in a vertical direction by three pixels. In other words, the SP constituent pixel B of the spot SP5 is the fourth pixel in a vertical direction from the same type of the SP constituent pixel B of the adjacent spot SP5.

Figure 9:
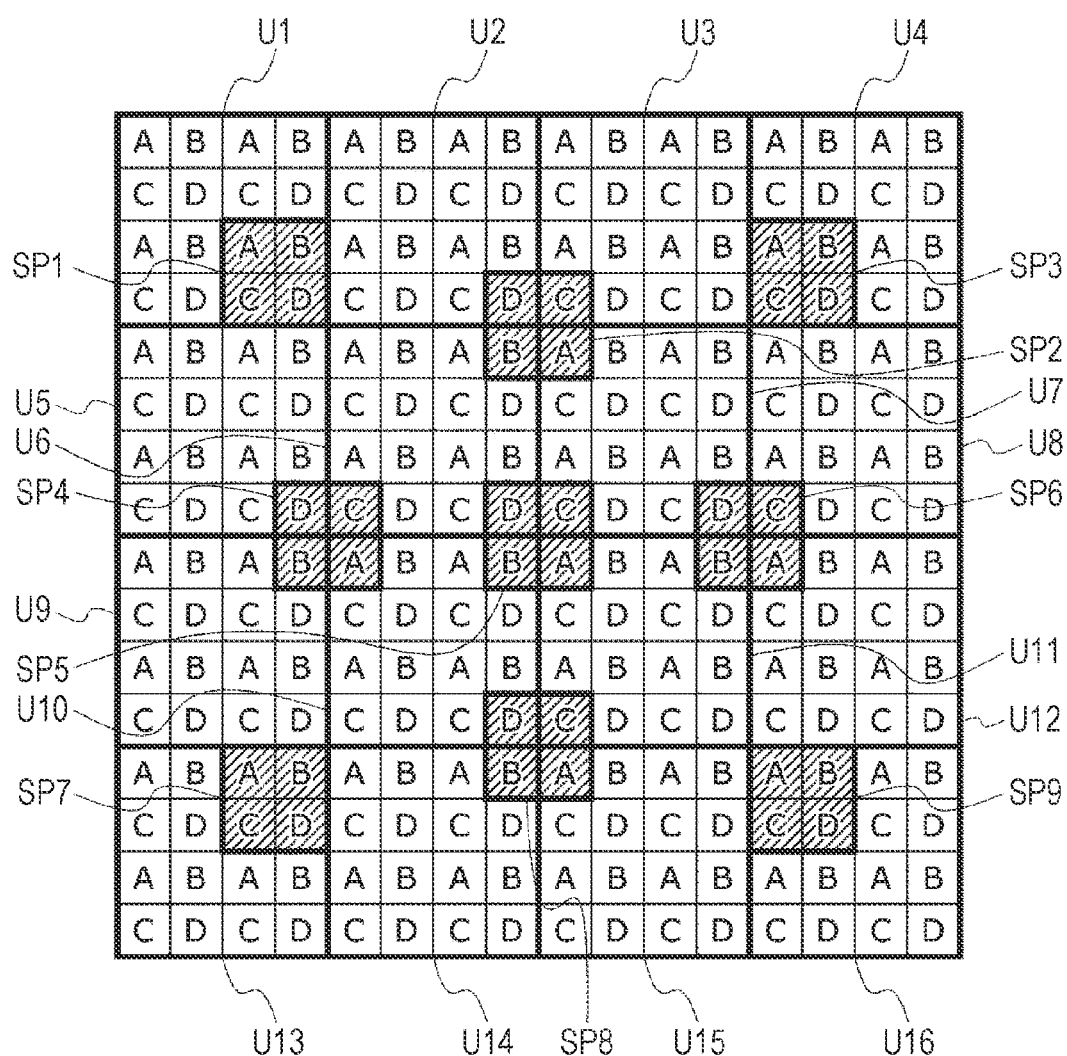
FIG. 9 is a view for explaining setting of spots SP in accordance with a spacing rule.

In a case where a plurality of spots SP is set for the pixel array 112 in accordance with such a spacing rule, as can be clear from FIG. 9, the number of the SP constituent pixels A to D selected as active pixels within each unit U always becomes equal to or less than one. It is therefore possible to use a common signal line 271 for each of the SP constituent pixels of the same type (SP constituent pixels A to D) within the unit U as illustrated in FIG. 7.

While an example has been described in the above-described example where one spot SP includes four pixels (SP constituent pixels) of 2×2, the above-described example can be similarly applied also in a case where the number of constituent pixels of the spot SP is different. For example, also in a case where one spot SP includes two pixels (the SP constituent pixel A and the SP constituent pixel B) of 2×1, or in a case where one spot SP includes six pixels (the SP constituent pixel A, the SP constituent pixel B, the SP constituent pixel C, the SP constituent pixel D, the SP constituent pixel E and the SP constituent pixel F) of 2×3, the number of the same type of the SP constituent pixels selected as active pixels within each unit U of 4×4 always becomes equal to or less than one by a plurality of spots SP being set in accordance with the above-described spacing rule.

A case where the number of pixels included in one unit U is not 16 pixels of 4×4 will be described next.

For example, a case where one unit U includes 25 pixels of 5×5 will be described. It is assumed that one spot SP includes four pixels (the SP constituent pixels A to D) of 2×2 in a similar manner to the above-described example.

In a case where one unit U includes 25 pixels of 5×5, the pixel driving unit 111 determines an adjacent spot SP so that the same type of the respective SP constituent pixels A to D of the spot SP comes fifth or any later in other adjacent spots SP both in a horizontal direction and in a vertical direction. In other words, the pixel driving unit 111 determines each spot SP so that a predetermined SP constituent pixel (for example, the SP constituent pixel A) in a first spot SP within the pixel array 112 is separate from the same type of the SP constituent pixel (for example, the SP constituent pixel A) of a second spot SP adjacent to the first spot SP by four or more pixels. The number of the same type of the SP constituent pixels selected as active pixels within each unit U of 5×5 always becomes equal to or less than one by a plurality of spots SP being set in accordance with this spacing rule.

Next, a case where one unit U includes 36 pixels of 6×6 will be described. It is assumed that one spot SP includes four pixels (the SP constituent pixels A to D) of 2×2 in a similar manner to the above-described example.

In a case where one unit U includes 36 pixels of 6×6, the pixel driving unit 111 determines an adjacent spot SP so that the same type of the respective SP constituent pixels A to D of the spot SP comes sixth or any later in other adjacent spots SP both in a horizontal direction and in a vertical direction. In other words, the pixel driving unit 111 determines each spot SP so that a predetermined SP constituent pixel (for example, the SP constituent pixel A) in a first spot SP within the pixel array 112 is separate from the same type of the SP constituent pixel (for example, the SP constituent pixel A) of a second spot SP adjacent to the first spot SP by five or more pixels. The number of the same type of the SP constituent pixels selected as active pixels within each unit U of 6×6 always becomes equal to or less than one by a plurality of spots SP being set in accordance with this spacing rule.

Relationship between the signal lines 271 which are used in common within the unit U and the spacing rule can be described as follows. In the pixel array 112, in a case where one spot SP includes N×M pixels (N>0, M>0, where N and M do not become 1 at the same time), and one unit U includes L×L (L>1), output of the same type of the plurality of SP constituent pixels within one unit U is put together with one signal line 271 using one or more vertical wirings 261. The pixel driving unit 111 determines a plurality of spots SP within the pixel array 112 so that the same type of the respective SP constituent pixels of the spot SP comes L-th or any later in other adjacent spots SP both in a horizontal direction and in a vertical direction. This can substantially reduce the number of the signal lines 271 from the pixel array 112 to the MUX 113, so that it is possible to improve crosstalk and skew of the detection signal PFout, signal delay, and the like.

Note that it is also possible to use one or more elements included in the respective SP constituent pixels in common among the same type of the SP constituent pixels within the unit U as well as using the signal lines 271 in common among the same type of SP constituent pixels within the unit U.

For example, it is possible to use the output buffer 216 provided in a final stage in the first pixel circuit of the pixel 121 illustrated in FIG. 3 in common among the same type of the SP constituent pixels within the unit U.

Figure 10:
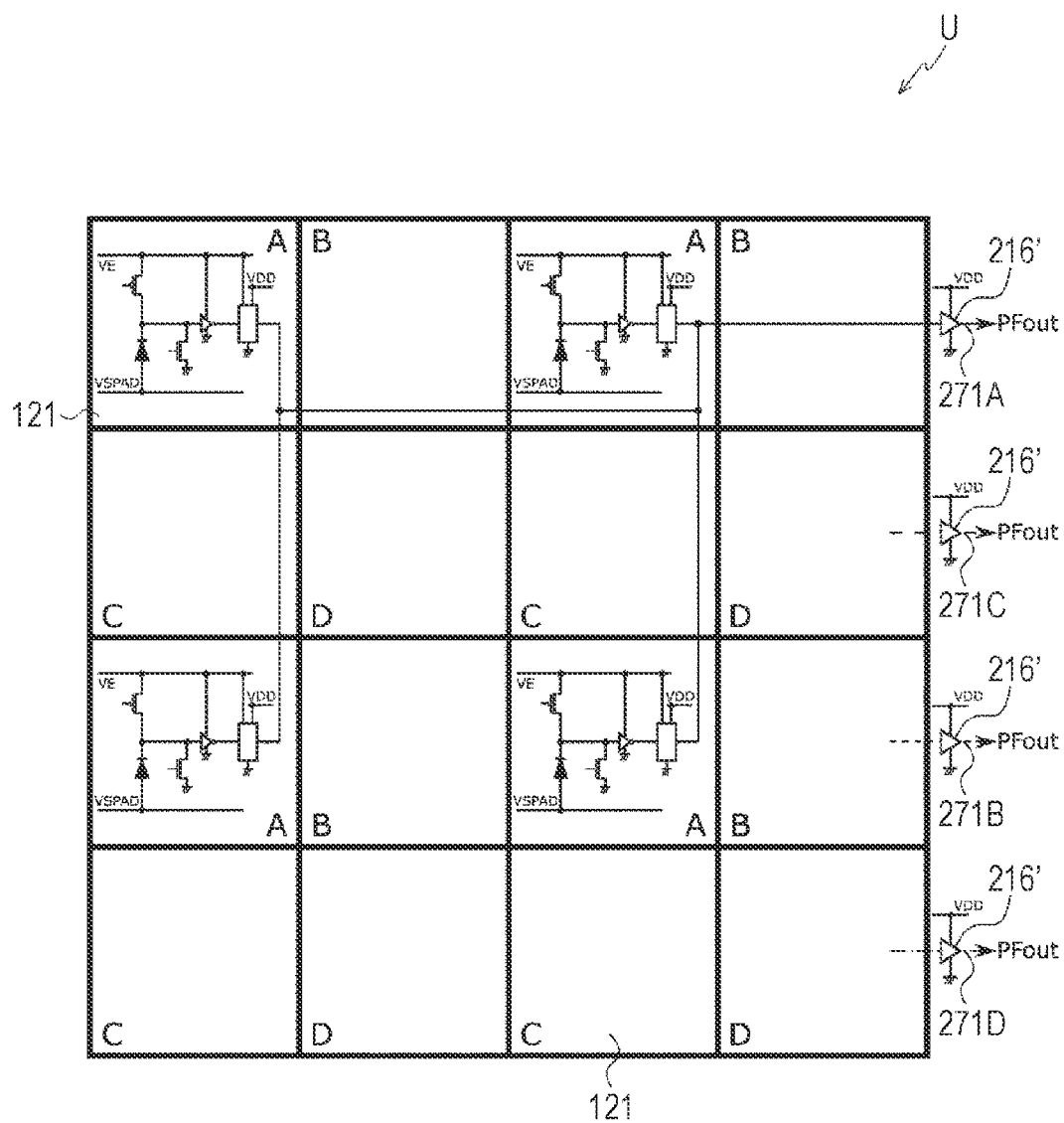
FIG. 10 is a view illustrating a circuit configuration of a unit using a common output buffer.

FIG. 10 illustrates a circuit configuration of the unit U in which the output buffer 216 is used in common among the same type of the SP constituent pixels within the unit U.

In FIG. 10, in place of the output buffers 216 provided for each pixel, one output buffer 216' to be used in common among four SP constituent pixels A within one unit U are provided.

Further, while illustration of circuits within pixels of the SP constituent pixels B to D is omitted, one output buffer 216' is provided for the same type of four SP constituent pixels for each of the SP constituent pixels B to D in a similar manner.

Note that while FIG. 10 illustrates the output buffers 216' outside the unit U to facilitate understanding, the output buffers 216' can be provided within a predetermined SP constituent pixel inside the unit U.

While FIG. 10 illustrates an example where the output buffers 216 of the respective pixels 121 are integrated, in a case where each pixel includes other elements such as, for example, computation circuits such as an MUX, a register and an OR circuit, these elements may be used in common among the same type of the SP constituent pixels. In other words, elements to be used in common among the same type of the SP constituent pixels within the unit U are not limited to the output buffer.

<7. Second Pixel Circuit Configuration Example>

Figure 11:
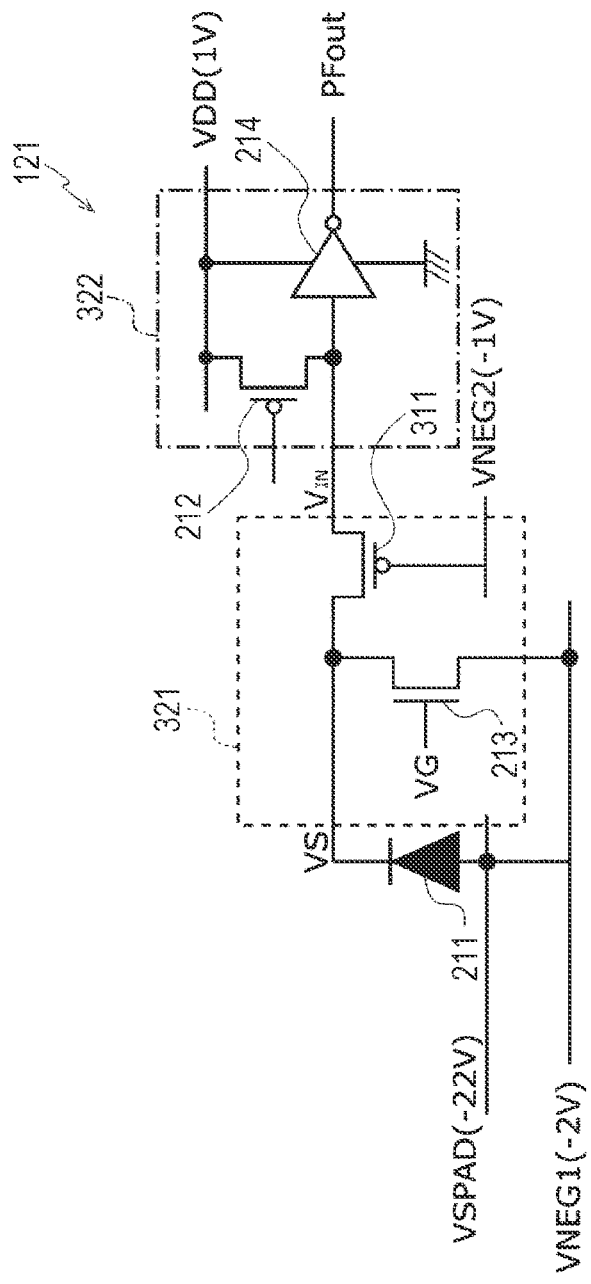
FIG. 11 is a view illustrating a configuration example of a second pixel circuit.

FIG. 11 illustrates a configuration example of a second pixel circuit of the pixel 121.

Note that, in FIG. 11, the same reference numerals are assigned to parts which are in common with the first pixel circuit illustrated in FIG. 3, and description of the parts will be omitted as appropriate.

The pixel 121 illustrated in FIG. 11 includes the SPAD 211, the transistor 212, the transistor 213, the inverter 214 and a transistor 311. The transistor 213 includes an N-type MOS transistor, and the transistors 212 and 311 include a P-type MOS transistor.

The second pixel circuit in FIG. 11 is in common with the first pixel circuit in FIG. 3 in that the second pixel circuit includes the SPAD 211, the transistor 212, the transistor 213 and the inverter 214. The second pixel circuit is different from the first pixel circuit in a power supply voltage to be supplied to each element.

More specifically, while the source of the transistor 213 is connected to the ground in the first pixel circuit, the source of the transistor 213 is connected to a power supply VNEG1 which is a negative bias in the second pixel circuit. The power supply VNEG1 is, for example, set at −2 V. Further, the second pixel circuit is constituted so that a voltage between the anode and the cathode of the SPAD 211 becomes equal to or lower than the breakdown voltage VBD when the transistor 213 is switched on by the Hi gating control signal VG, and thus, a power supply VSPAD to be supplied to the anode of the SPAD 211 is set at −22 V which is lower than the potential of the first pixel circuit (in the above-described example, −20 V).

Still further, while the source of the transistor 212 is connected to the power supply voltage VE (3 V) which is the first power supply voltage in the first pixel circuit, the source of the transistor 212 is connected to the power supply voltage VDD (1 V) which is the second power supply voltage lower than the first power supply voltage in the second pixel circuit. In a case where the pixel 121 is controlled to be an active pixel, as a result of the power supply voltage VDD (1 V) being supplied to the cathode of the SPAD 211 via the transistor 311 and the transistor 212, the voltage between the anode and the cathode of the SPAD 211 becomes a reverse voltage of 23 V which is the same as that in the first pixel circuit.

Further, the second pixel circuit in FIG. 11 is different from the first pixel circuit in that the transistor 311 which includes a P-type MOS transistor is newly added between the SPAD 211 and the inverter 214. More specifically, a drain of the transistor 311 is connected to the cathode of the SPAD 211 and the drain of the transistor 213, and a source of the transistor 311 is connected to the drain of the transistor 212 and the input terminal of the inverter 214. A gain of the transistor 311 is connected to a power supply VNEG2 which is a negative bias. The power supply VNEG2 is, for example, set at −1 V.

The transistor 311 which functions as a voltage conversion circuit, converts a signal having the cathode voltage VS of the SPAD 211 to be supplied to the drain into a signal having a voltage $V_{IN}$ in a positive range and outputs the signal to the inverter 214. The power supply VNEG2 (−1 V) which is the same negative bias (−Vgs) as a transistor threshold of the transistor 311 is applied to a gate of the transistor 311. The transistor 311 interrupts if the voltage $V_{IN}$ which is a signal input to the inverter 214 reaches a voltage value (0 V) which is a value increased from the power supply VNEG2 (−1 V) by the transistor threshold. The transistor 311 therefore also functions as a voltage clamp circuit.

The inverter 214 outputs a Hi detection signal PFout in a case where the voltage $V_{IN}$ input to the inverter 214 is Lo, and outputs a Lo detection signal PFout in a case where the voltage $V_{IN}$ is Hi. The inverter 214 is an output unit which outputs a detection signal PFout indicating incidence of a photon on the SPAD 211.

Figure 12:
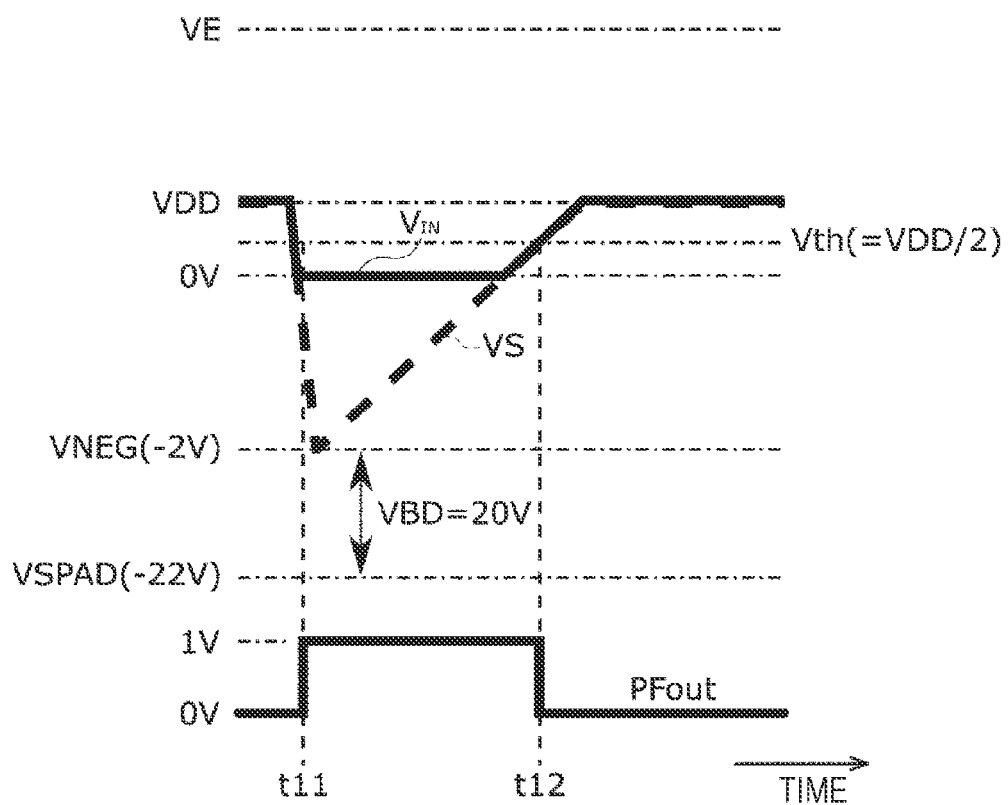
FIG. 12 is a view for explaining operation of a pixel in FIG. 11.

FIG. 12 is a graph illustrating potential change in a case where the pixel 121 in FIG. 11 is set as an active pixel, and light is incident.

In a case where light is incident, as illustrated in FIG. 12, the cathode voltage VS of the SPAD 211 fluctuates in a range from the VDD (1 V) to −2 V, but the voltage $V_{IN}$ to be input to the inverter 214 falls within a positive range from the VDD (1 V) to 0 V.

The inverter 214 outputs an Lo detection signal PFout in a case where the voltage $V_{IN}$ to be input is equal to or higher than a predetermined threshold voltage Vth (=VDD/2) and outputs a Hi detection signal PFout in a case where the voltage $V_{IN}$ is lower than the predetermined threshold voltage Vth. In the example in FIG. 12, a Hi detection signal PFout is output during a period from time t11 to time t12.

From the above, the transistor 213 and the transistor 311 included in a dashed region 321 among the second pixel circuit in FIG. 11 are elements (group) which apply an excess bias higher than the breakdown voltage VBD of the SPAD 211 by 3 V in a similar manner to the first pixel circuit. Meanwhile, the transistor 212 and the inverter 214 included in a dashed-dotted region 322 are elements (group) which operate at the power supply voltage VDD.

Consequently, in the second pixel circuit, it is possible to eliminate the power supply voltage VE which is a power supply voltage higher than the power supply voltage VDD, and it is possible to reduce the number of elements which require to operate with a high-voltage power supply from four within the region 221 of the first pixel circuit to two within the region 321. Reduction of elements operating with a high-voltage power supply can lead to reduction in the number of parts, reduction in a circuit area, and reduction of power consumption. Reduction of circuits can improve signal characteristics (such as delay and skew) until when the detection signal PFout reaches the time measuring unit 114.

<8. Use Example of Ranging System>

Figure 13:
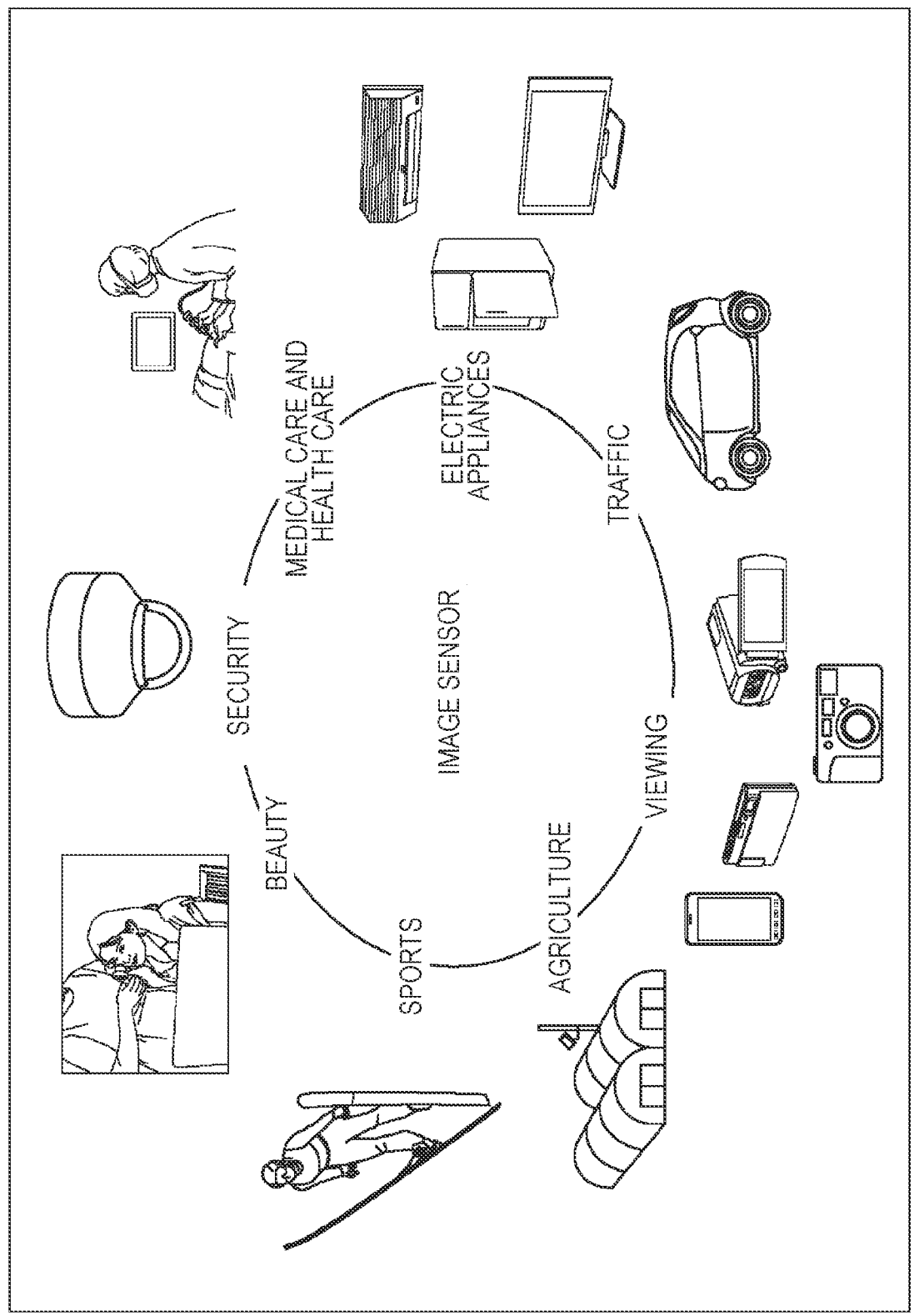
FIG. 13 is a view for explaining a use example of the ranging system.

FIG. 13 is a view illustrating a use example of the above-described ranging system 11.

The above-described ranging system 11 can be used in various cases of sensing light such as, for example, visible light, infrared light, ultraviolet light and X-ray as described below.

- an apparatus which captures an image to be provided for viewing, such as a digital camera and a mobile device with a camera function
- an apparatus to be provided for traffic, such as an in-vehicle sensor which captures images of portions in front of, behind, around, interior of, and the like, a monitoring camera which monitors traveling vehicles and roads, and a range sensor which measures a distance between vehicles, and the like for safe driving such as automatic stop, and to recognize a state of a driver
- an apparatus to be provided for electric appliances such as a TV, a refrigerator and an air conditioner to capture an image of gesture of a user to operate equipment in accordance with the gesture
- an apparatus to be provided for medical care and health care, such as an endoscope and an apparatus which captures images of vessels by receiving infrared light
- an apparatus to be provided for security, such as a security camera for crime prevention and a camera for personal authentication
- an apparatus to be provided for beauty care, such as a skin checker which captures an image of skin and a microscope which captures an image of scalp
- an apparatus to be provided for sports, such as an action camera and a wearable camera for sports use
- an apparatus to be provided for agriculture, such as a camera for monitoring states of fields and crops <9. Application Example to Mobile Objects>

The technology (present technology) according to the present disclosure is applicable to a variety of products. For example, the technology according to the present disclosure is implemented as devices mounted on any type of mobile objects such as automobiles, electric vehicles, hybrid electric vehicles, motorcycles, bicycles, personal mobilities, airplanes, drones, ships, and robots.

Figure 14:
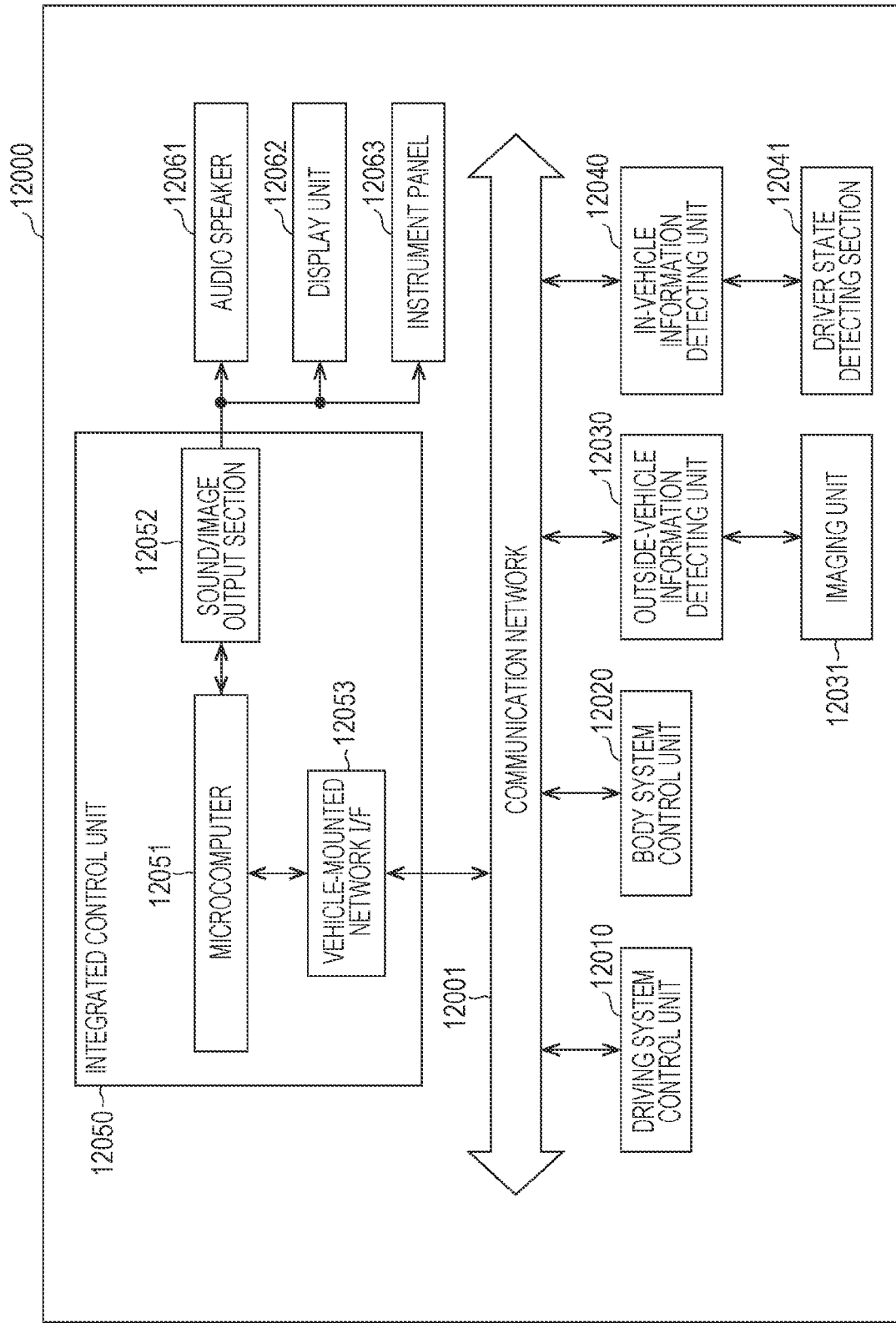
FIG. 14 is a block diagram illustrating an example of a schematic configuration of a vehicle control system.

FIG. 14 is a block diagram illustrating a schematic configuration example of a vehicle control system which is an example of a mobile object control system to which a technology according to the present disclosure is applicable.

The vehicle control system 12000 includes a plurality of electronic control units connected to each other via a communication network 12001. In the example illustrated in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output section 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 14, an audio speaker 12061, a display unit 12062, and an instrument panel 12063 are exemplified as the output device. The display unit 12062 may, for example, include at least one of an on-board display or a head-up display.

Figure 15:
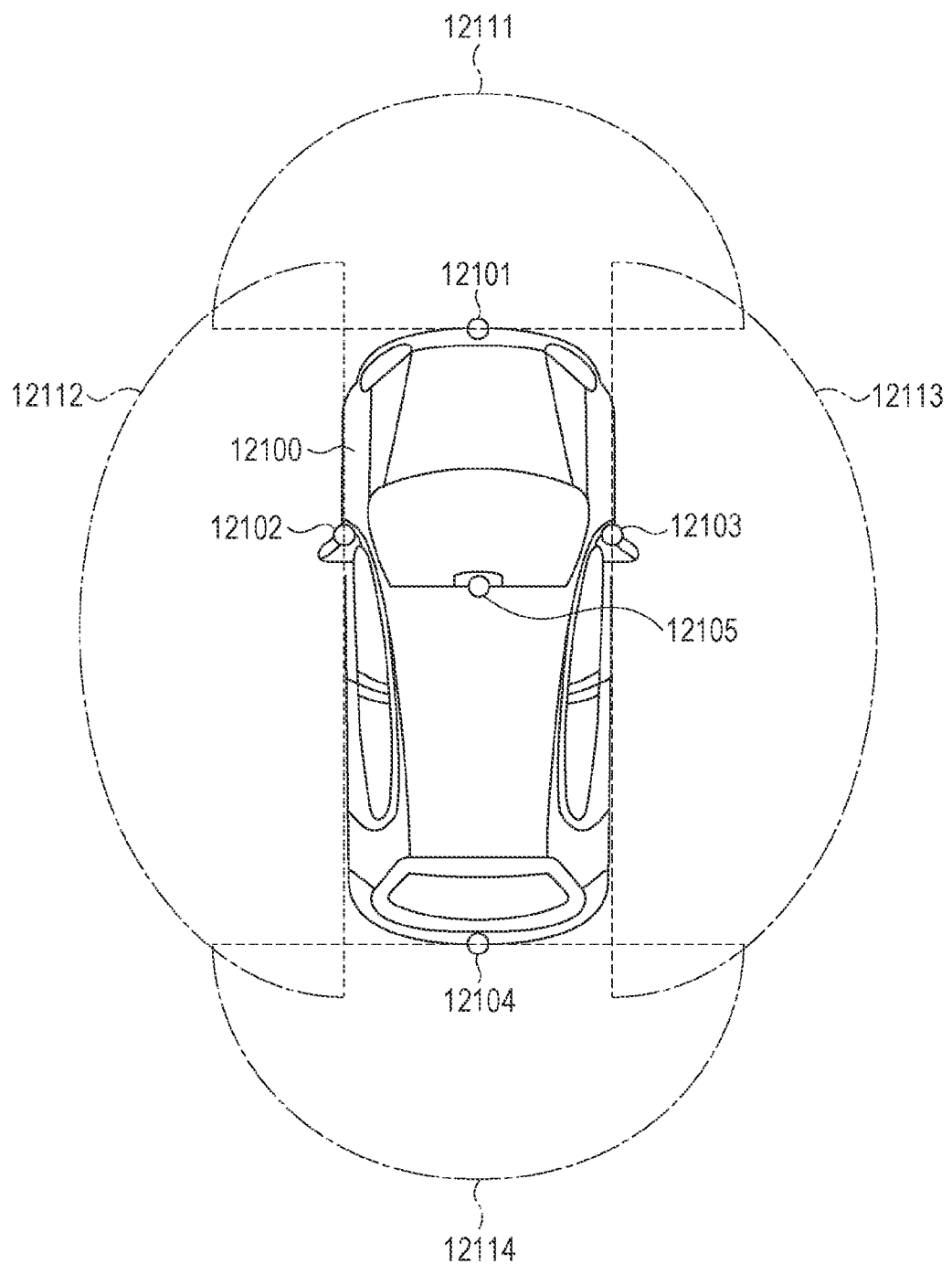
FIG. 15 is an explanatory diagram illustrating an example of installation positions of an outside-vehicle information detecting unit and an imaging unit.

FIG. 15 is a diagram illustrating an example of an installation position of the imaging unit 12031.

In FIG. 15, a vehicle 12100 includes imaging units 12101, 12102, 12103, 12104, and 12105 as the imaging unit 12031.

imaging units 12101, 12102, 12103, 12104, and 12105 are positioned, for example, at the front nose, a side mirror, the rear bumper, the back door, and the upper part, or the like, of the windshield in the vehicle compartment of the vehicle 12100. The imaging unit 12101 provided to the front nose and the imaging unit 12105 provided to the upper part of the windshield in the vehicle compartment obtain mainly an image of the front of the vehicle 12100. The imaging units 12102 and 12103 attached to the side mirrors obtain mainly images of the areas on the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Additionally, FIG. 15 illustrates an example of the imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the side mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, etc., and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output section 12052 controls the display unit 12062 so that a square contour line for emphasis is displayed so as to be superimposed on the recognized pedestrian. Further, the sound/image output section 12052 may also control the display unit 12062 so that an icon or the like representing the pedestrian is displayed at a desired position.

In the above, an example of the vehicle control system to which the technology related to the present disclosure can be applied is described. The technology according to the present disclosure can be applied to the imaging unit 12031 or the like within the above-described configuration. Specifically, for example, the ranging system 11 illustrated in FIG. 1 can be applied to the Imaging unit 12031. The Imaging unit 12031 is a LIDAR, for example, and is used for detecting a distance to an object around the vehicle 12100 and the object. By applying the technology of the present disclosure to the imaging unit 12031, the accuracy of detecting the distance to the object around the vehicle 12100 and the object will be improved. As a result, for example, it becomes possible to issue a warning of collision of the vehicle at an appropriate timing so as to prevent a traffic accident.

Further, in the present specification, a system has the meaning of a set of a plurality of structural elements (such as an apparatus or a module (part)), and does not take into account whether or not all the structural elements are in the same casing. Therefore, the system may be either a plurality of apparatuses stored in separate casings and connected through a network, or an apparatus in which a plurality of modules is stored within a single casing.

Further, an embodiment of the present technology is not limited to the embodiments described above, and various changes and modifications may be made without departing from the scope of the present technology.

Note that the effects described in the present specification are not limiting but are merely examples, and there may be additional effects other than the description in the present specification.

Further, the present technology may also be configured as below.

(1)

A light receiving element including:

a pixel array in which a plurality of pixels including SPADs in units of pixel is arranged in a matrix; and a pixel driving unit configured to control respective pixels of the pixel array to be active pixels or non-active pixels, in which the pixel driving unit controls the pixels to be the active pixels in units of spot including N×M pixels (N>0, M>0, where N and M do not become 1 at a same time), and one signal line which outputs a detection signal is disposed at the pixel array for a plurality of spot constituent pixels of a same type within one unit where the one unit includes L×L pixels (L>1).

(2)

The light receiving element according to (1), further including:
    a wiring which connects a plurality of the spot constituent pixels of a same type within the one unit.

(3)

The light receiving element according to (1) or (2), further including:
    at least one element to be utilized in common among a plurality of the spot constituent pixels of a same type within the one unit.

(4)

The light receiving element according to any one of (1) to (3),
    in which, in a case where the plurality of spots is set at the pixel array, the pixel driving unit determines a plurality of the spots so that a same type of respective spot constituent pixels included in the spot comes L-th or any later in other adjacent spots both in a horizontal direction and in a vertical direction.

(5)

The light receiving element according to any one of (1) to (4),
    in which the one unit includes 4×4 pixels, and
    the unit of the spot includes 2×2 pixels.

(6)

A ranging system including:
an illumination apparatus configured to radiate irradiation light; and
a light receiving element configured to receive reflected light of the irradiation light,
    in which the light receiving element includes:
        a pixel array in which a plurality of pixels including SPADs in units of pixel is arranged in a matrix; and
        a pixel driving unit configured to control respective pixels of the pixel array to be active pixels or non-active pixels,
    the pixel driving unit controls the pixels to be the active pixels in units of spot including N×M pixels (N>0, M>0, where N and M do not become 1 at a same time), and
    one signal line which outputs a detection signal is disposed at the pixel array for a plurality of spot constituent pixels of a same type within one unit where the one unit includes L×L pixels (L>1).

REFERENCE SIGNS LIST

11 Ranging system
21 Illumination apparatus
22 Imaging apparatus
31 Illumination control unit
32 Light source
41 Imaging unit
42 Control unit
52 Light receiving element
53 Signal processing circuit
111 Pixel driving unit
112 Pixel array
U (U1 to U16) Unit
SP (SP1 to SP9) Spot
121 Pixel
122 Pixel drive line
211 SPAD
212, 213 Transistor
214 Inverter
215 Voltage conversion circuit
216, 216' Output buffer
241, 242 Signal line
261 Vertical wiring
271 (271A to 271D) Signal line
311 Transistor

The invention claimed is:

1. A light receiving element, comprising:
    a pixel array that includes a plurality of pixels in a matrix arrangement, wherein each of the plurality of pixels includes a single photon avalanche diode (SPAD);
    a pixel driving unit configured to control the plurality of pixels to be one of a plurality of active pixels or a plurality of non-active pixels, wherein
        the plurality of active pixels is in a plurality of pixel spots in the pixel array,
        each of the plurality of pixel spots includes N×M pixels of the plurality of pixels,
        N>0,
        M>0, and
        N and M are not equal to 1 at a same time;
    one signal line configured to output a detection signal from a plurality of spot constituent pixels of a same type in one unit of pixels, wherein
        the pixel array includes the one signal line and the one unit of pixels,
        the one unit of pixels includes L×L pixels of the plurality of pixels,
        L>1, and
        the plurality of pixel spots includes the plurality of spot constituent pixels; and
    a wiring that connects the plurality of spot constituent pixels of the same type in the one unit of pixels.

2. The light receiving element according to claim 1, further comprising:
    at least one element common for each of the plurality of spot constituent pixels of the same type in the one unit of pixels.

3. The light receiving element according to claim 1, wherein
    the plurality of pixel spots includes a first pixel spot and a second pixel spot, and
    the pixel driving unit is further configured to determine the plurality of pixel spots based on determination that the same type of a spot constituent pixel in the first pixel spot comes at or after L number of pixels in the second pixel spot, and
    the second pixel spot is adjacent to the first pixel spot in one of a horizontal direction or a vertical direction.

4. The light receiving element according to claim 1, wherein
    the one unit of pixels includes 4×4 pixels; and
    each of the plurality of pixel spots includes 2×2 pixels.

5. A ranging system, comprising:
an illumination apparatus configured to radiate irradiation light; and
a light receiving element configured to receive reflected light of the irradiation light, wherein
    the light receiving element includes:
        a pixel array that includes a plurality of pixels in a matrix arrangement, wherein each of the plurality of pixels includes a single photon avalanche diode (SPAD);
        a pixel driving unit configured to control the plurality of pixels to be one of a plurality of active pixels or a plurality of non-active pixels, wherein
            the plurality of active pixels is in a plurality of pixel spots in the pixel array, each of the plurality of pixel spots of pixels
includes N×M pixels of the plurality of pixels,

N>0,

M>0, and

N and M are not equal to 1 at a same time;

one signal line configured to output a detection signal from a plurality of spot constituent pixels of a same type in one unit of pixels, wherein the pixel array includes the one signal line and the one unit of pixels, the one unit of pixels includes L×L pixels of the plurality of pixels, L>1, and the plurality of pixel spots includes the plurality of spot constituent pixels; and a wiring that connects the plurality of spot constituent pixels of the same type in the one unit of pixels.

6. A light receiving element, comprising:

a pixel array that includes a plurality of pixels in a matrix arrangement, wherein each of the plurality of pixels includes a single photon avalanche diode (SPAD);

a pixel driving unit configured to control the plurality of pixels to be one of a plurality of active pixels or a plurality of non-active pixels, wherein the plurality of active pixels is in a plurality of pixel spots in the pixel array, and each of the plurality of pixel spots includes 2×2 pixels of the plurality of pixels; and one signal line configured to output a detection signal from a plurality of spot constituent pixels of a same type in one unit of pixels, wherein the pixel array includes the one signal line and the one unit of pixels, the one unit of pixels includes 4×4 pixels of the plurality of pixels, and the plurality of pixel spots includes the plurality of spot constituent pixels.

* * * * *